United States Patent
Leverenz et al.

(10) Patent No.: US 6,827,975 B2
(45) Date of Patent: *Dec. 7, 2004

(54) METHOD OF COATING CUTTING TOOLS

(75) Inventors: Roy V. Leverenz, Smyrna, TN (US); John Bost, Franklin, TN (US); James J. Oakes, Murfreesboro, TN (US)

(73) Assignee: TDY Industries, Inc., Pittsburgh, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/042,892

(22) Filed: Jan. 9, 2002

(65) Prior Publication Data

US 2002/0102403 A1 Aug. 1, 2002

Related U.S. Application Data

(62) Division of application No. 09/467,936, filed on Dec. 21, 1999, now Pat. No. 6,447,890, which is a continuation-in-part of application No. 09/390,570, filed on Sep. 3, 1999, now abandoned, which is a continuation of application No. 08/860,163, filed on Jun. 16, 1997, now Pat. No. 5,958,569.

(51) Int. Cl.$^7$ .............................................. C23C 16/30
(52) U.S. Cl. ............................. 427/249.1; 427/249.17; 427/255.31; 427/255.394; 427/255.7
(58) Field of Search ......................... 427/249.1, 249.17, 427/255.31, 255.394, 255.7

(56) References Cited

U.S. PATENT DOCUMENTS

| | | | |
|---|---|---|---|
| 3,640,689 A | 2/1972 | Glaski et al. | |
| 3,854,971 A | 12/1974 | Conley et al. | |
| 3,900,592 A | * 8/1975 | Kennedy et al. | ............ 427/569 |
| 4,101,703 A | 7/1978 | Schintimeister | |
| 4,268,569 A | 5/1981 | Hale | |
| 4,269,899 A | * 5/1981 | Fuyama et al. | ............. 428/457 |
| 4,399,168 A | 8/1983 | Kullander et al. | |
| 4,463,062 A | 7/1984 | Hale | |
| 4,490,191 A | 12/1984 | Hale | |
| 4,497,874 A | 2/1985 | Hale | |
| 4,501,786 A | 2/1985 | Hale | |
| 4,525,415 A | 6/1985 | Forat | |
| 4,608,098 A | 8/1986 | Hale | |
| 4,610,931 A | 9/1986 | Nemeth et al. | |
| 4,619,866 A | 10/1986 | Smith et al. | |
| 4,830,886 A | * 5/1989 | Cho et al. | .............. 427/249.19 |
| 5,232,318 A | 8/1993 | Santhanam et al. | |
| 5,325,747 A | 7/1994 | Santhanam et al. | |
| 5,364,209 A | 11/1994 | Santhanam et al. | |
| 5,372,873 A | 12/1994 | Yoshimura et al. | |
| 5,750,247 A | * 5/1998 | Bryant et al. | ................ 428/323 |
| 5,958,569 A | * 9/1999 | Leverenz et al. | ........... 428/216 |
| 6,056,999 A | * 5/2000 | Narasimhan | ................ 428/699 |

FOREIGN PATENT DOCUMENTS

| | | |
|---|---|---|
| GB | 1291387 | 2/1969 |
| GB | 1291388 | 2/1969 |

OTHER PUBLICATIONS

US 5,143,488, 9/1992, Santhanam et al. (withdrawn)
Article entitled "A Look at the Hafnium Nitride Coatings", authored by Roy V. Leverenz.
Teledyne Firth Sterling Catalog, No. EM–86A, entitled EX Mill M–Series Positive/Negative.

* cited by examiner

Primary Examiner—Bret Chen
(74) Attorney, Agent, or Firm—Patrick J. Viccaro

(57) ABSTRACT

Methods of coating cutting tool inserts including a hard substrate and a plurality of coatings are disclosed. In one embodiment, the method comprises applying a first coating of at least 2 microns to at least a portion of the hard substrate and applying a second coating. The first coating can comprise at least one of a metal carbide, a metal nitride, and a metal carbonitride of at least one metal selected from zirconium and hafnium. The second coating can comprise at least one of a metal carbide, a metal boride, a metal nitride, and a metal oxide of a metal selected from groups IIIA, IVB, VB, and VIB of the periodic table. Optionally, third and fourth coatings are also applied to the cutting tool inserts.

16 Claims, 6 Drawing Sheets

METHOD OF COATING CUTTING TOOLS

This is a divisional of U.S. Ser. No. 09/467,936 filed Dec. 21, 1999, now U.S. Pat. No. 6,447,890, which is a continuation-in-part of U.S. Ser. No. 09/390,570, filed Sep. 3, 1999 (now abandoned), which is a continuation of U.S. Pat. No. 5,958,569 issued Sep. 28, 1999, which is the National Stage of International Application Number PCT/US96/17107 filed Oct. 23, 1996.

FIELD OF THE INVENTION

The present invention relates to the field of cutting tools and particularly to coatings for ceramic coated hard metal cutting tool inserts used for cutting, milling, drilling and other applications such as boring, trepanning, threading and grooving.

BACKGROUND OF THE INVENTION

Coatings improve the performance of cutting tools, especially ceramic or oxide coatings on carbide or hard metal cutting tools. Ever since carbide cutting tool inserts have been ceramic coated with, for example, aluminum oxide ($Al_2O_3$), there has been a continuing effort to improve the adherence of the coating to the substrate. When the first aluminum oxide coating was applied directly to a substrate of the carbide or hard metal type, the oxygen in the aluminum oxide reacted with the substrate which reduced the adherence.

It has been known to improve the properties of tool inserts made from a sintered hard metal substrate (metallic carbide bonded with a binder metal) by applying a wear-resistant carbide layer. See UK Patent Nos. 1,291,387 and 1,291,388 which disclose methods of applying a carbide coating with improved adherence; specifically, controlling the composition of the gas used for deposition of the carbide so that a decarburized zone was formed in the sintered hard metal at the interface with the wear-resistant carbide. The decarburized zone known as an eta layer, however, tends to be hard and brittle, resulting in breakage. It has also been known to apply a ceramic or oxide wear-resistant coating (usually aluminum oxide) upon the sintered metal substrate. However, as already explained, the oxide layer directly upon the sintered metal body may disrupt the sintered metal morphology and binding ability. A number of patents have disclosed the use of an intermediate layer of carbides, carbonitrides and/or nitrides. See U.S. Pat. Nos. 4,399,168 and 4,619,866. An intermediate titanium carbide (TiC) layer improved toughness but still an eta layer existed limiting the application of the coated tool inserts to finishing cuts. A layer of titanium nitride (TiN) applied before the TiC layer eliminated the eta layer but toughness was still less than required. See U.S. Pat. No. 4,497,874. Intermediate layers of titanium carbonitride (TiCN) in place of the TiC intermediate layer have been proposed. See U.S. Pat. Nos. 4,619,866 and 4,399,168. A thin surface oxidized bonding layer comprising a carbide or oxycarbide of at least one of tantalum, niobium and vanadium between the hard metal substrate and the outer oxide wear layer has been proposed. See U.S. Pat. No. 4,490,191.

The ceramic coating ($Al_2O_3$) does not adhere well enough to the TiC and many TiCN intermediate coatings when used to enhance the adhesion of the coating to the cemented carbide substrate. Due to thermal expansion differences, there is a tendency to delaminate. With the stress caused by the thermal expansion difference, coatings tend to perform inconsistently. These intermediate coatings are mostly characterized by a straight line interface between the intermediate coating and the oxide coating as shown in FIG. 1. This results in a weak bond. Adhesion may be increased some by making the substrate rough but the projections provided by the roughening are spaced too far apart to perform consistently.

Another problem experienced with carbide and hard metal cutting tools is the frequent failure of those tools due to thermal shock. The inserts become very hot during cutting and then cool upon application of coolants or when disposed outside the cut. Cycles of heating and cooling result in steep temperature gradients within the inserts, and the accompanying stresses may cause cracks in the inserts that initiate fractures and reduce tool life. Thus, coatings that reduce the occurrence of fractures from thermal shock may considerably enhance tool life.

With the coatings, according to the present invention, increased wear resistance as well as adhesion strength are provided in ceramic coatings on hard metal cutting tools. According to another aspect of the invention, coatings are provided that reduce thermal shock experienced by carbide and hard metal cutting tool inserts.

SUMMARY OF THE INVENTION

Briefly, according to this invention, there is provided a cutting tool insert comprising a hard metal substrate having at least two wear-resistant coatings. One of the coatings is a ceramic coating. An intermediate coating under the ceramic coating is comprised of carbonitride having a nitrogen to carbon atomic ratio between about 0.7 and about 0.95 whereby the carbonitride coating forms fingers interlocking the ceramic coating, thus improving the adherence and fatigue strength of the ceramic coating. Preferably, the nitrogen to carbon atomic ratio in the carbonitride coating lies between about 0.75 and 0.95 as determined by X-ray diffraction. The cutting tool insert also may include an additional coating, deposited on the substrate, that is a layer of at least about 2 microns, and preferably at least about 2 up to about 5 microns, in thickness and comprises at least one of a metal carbide, a metal nitride, or a metal carbonitride of a metal selected from zirconium and hafnium.

According to one embodiment of this invention, the hard metal cutting tool insert has two intermediate coatings between the hard metal substrate and the aluminum oxide surface coating. The coating adjacent the substrate is a 1 to 4 micron layer of titanium nitride. The coating over the titanium nitride layer is a 2 to 4 micron thick titanium carbonitride layer and the aluminum oxide coating is a 1 to 10 micron layer.

According to the preferred embodiment, the hard metal substrate of the cutting tool insert has four coatings as follows: a 2 micron titanium nitride interior coating, a 3 micron titanium carbonitride intermediate coating, a 6 micron aluminum oxide intermediate coating, and a 2 micron Ti(C, N), i.e., TiC, TiN, $TiC_xN_y$ exterior coating.

Titanium is not the only suitable metal for use in the carbonitride coating. The metal may be comprised of, in addition to titanium, zirconium, hafnium, vanadium, niobium, tantalum, chromium, molybdenum and tungsten.

The cutting tool insert substrate, according to this invention, typically comprises 3% to 30% of a binder metal from the iron group including, in addition to iron, nickel and cobalt and mixtures thereof and between 70% and 97% of a carbide selected from the group tungsten carbide, titanium carbide, tantalum carbide, niobium carbide, molybdenum carbide, zirconium carbide and hafnium carbide. In addition to carbides, the cutting tool insert substrate may also include nitrides.

According to a preferred embodiment, the cutting tool insert substrate has a binder phase enriched surface layer, that is, a surface layer enriched with a higher percentage of cobalt or other binder metal.

Briefly, according to this invention, there is provided a method of making a coated cutting tool insert having a wear-resistant coating comprising the steps of depositing a metal carbonitride coating having a nitrogen to carbon atomic ratio between about 0.7 and about 0.95 by adjusting the reactants used for chemical vapor deposition of said coating and depositing a ceramic coating directly over said carbonitride coating whereby said carbonitride coating and ceramic coating have interlocking microscopic fingers.

According to another aspect of the invention, there is provided a cutting tool insert including a hard substrate and a plurality of coatings on at least a portion of the substrate. The substrate may be any type suitable for use as a cutting tool insert and may be, for example, a cemented carbide as described above. The plurality of coatings includes at least a first and a second coating. The first coating is a layer at least about 2 microns and preferably about 2 to about 5 microns in thickness deposited on the substrate and includes at least one a metal carbide, a metal nitride, or a metal carbonitride of a metal selected from zirconium and hafnium. Preferably, the first coating is a layer of zirconium nitride or hafnium nitride. The second coating is a layer including at least one of a metal carbide, a metal nitride, or a metal oxide of a metal selected from groups IIIA (B, Al, Ga), IVB (Ti, Zr, Hf), VB (V, Nb, Ta), and VIB (Cr, Mo, W) of the periodic table. One or more additional layers optionally may be provided intermediate the first and second coatings and also may be deposited exterior to the second coating. Thus, for example, the plurality of coatings may include a reinforcing coating, as described herein, provided intermediate the first and second coatings. The intermediate coating contacts and enhances adhesion of the second coating. More particularly, the intermediate coating may be a layer including a metal carbonitride that, as described herein, has a nitrogen to carbon atomic ratio that results in superior adherence of the second coating due to the development of interlocking fingers between the second coating and the intermediate coating.

Designations such as "first", "second", and "third" are used herein to identify individual coatings or layers only and, in the present description and the attached claims, do not necessarily refer to the ordering of the layers or coatings or their sequence of application on the substrate. Thus, for example, a "first" coating or layer is not necessarily in contact with or immediately adjacent a "second" coating or layer, and a "third" coating or layer, as well as additional coatings or layers, may be deposited intermediate the "first" and "second" coatings or layers.

BRIEF DESCRIPTION OF THE DRAWINGS

Further features and other objects and advantages of this invention will become clear from the following detailed description made with reference to the drawings in which.

DESCRIPTION OF THE PREFERRED EMBODIMENTS

Figure 1:
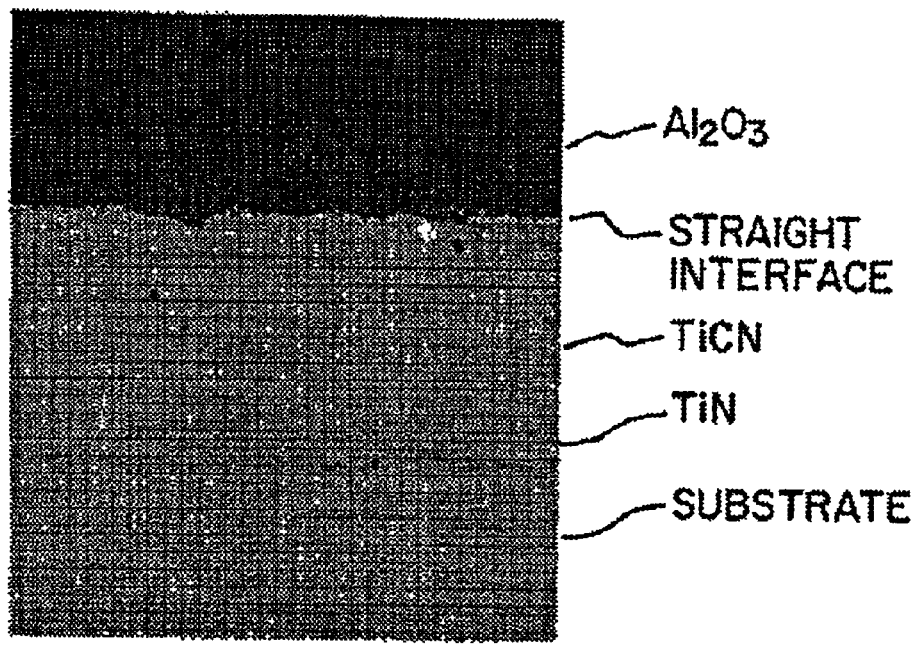
FIG. 1 is a photomicrograph of a polished section of a hard metal cutting tool insert having an oxide coating and an intermediate coating according to the prior art.

According to an aspect of this invention, hard metal cutting tools with a ceramic or oxide wear-resistant coating have a novel reinforcing intermediate coating. The hard metal substrate has a thin metal nitride coating overlaid with a titanium carbonitride coating. The wear-resistant ceramic coating overlays the metal carbonitride coating. The metal carbonitride intermediate layer is provided with a nitrogen to carbon atomic ratio that results in superior adherence of the oxide coating due to the development of interlocking fingers between the oxide coating and the metal carbonitride coating.

A test was devised to quantitatively evaluate the performance of ceramic coated hard metal cutting tool inserts. The test is performed on a turning machine. The stock is a cylindrical bar having a diameter greater than about 4 inches. The bar has four axial slots ¾ inch wide and 1½ inches deep extending the length of the bar. The bar is medium carbon steel AISI-SAE 1045 having a hardness of 25–30 HRC. The tools to be tested were used to reduce the diameter of the stock as follows.

| Feed Rate (inches per revolution or IPR) | Depth of Cut (inches) | Speed (surface feet per minute or SFM) |
|---|---|---|
| .020 | .050 | 500 |

It should be apparent that four times per revolution of the stock, the cutting tool insert impacts the edge of a slot. The cutting tool insert is run until it breaks through the coating or another failure is observed. Failures were observed in the following described test and were of the fretting type which is a precursor to the greater wear and cutting failure type.

In the following examples, the nitrogen to carbon atomic ratio in the titanium carbonitride intermediate layer or coating was determined by use of X-ray diffraction to first detect the lattice spacing of the carbonitride layer and then to calculate the atomic ratio of nitrogen to carbon or the atomic percentage of nitrogen based upon nitrogen and carbon. The lattice spacing of titanium carbide is known to be 1.53 Angstroms and the lattice spacing for titanium nitride is known to be 1.5 Angstroms. The range or difference is 0.03 Angstroms. Thus, a titanium carbonitride layer found to have a lattice spacing of 1.5073 Angstroms is 0.0227 Angstroms between the spacing for titanium nitride and titanium carbide. Hence, the atomic ratio of nitrogen to carbon is 0.0227 divided by 0.03 or 75.7% nitrogen based on total carbon and nitrogen in the carbonitride layer.

EXAMPLE I

Comparative Example

A tungsten carbide based substrate (94% tungsten carbide, 6% cobalt) of K20 material (K20 is a designation of the type of hard cutting material for machining as set forth in ISO Standard ISO513:1991(E) classified according to the materials and working conditions for which the hard metal cutting material can appropriately be used) was coated according to well-known procedures in a Bernex Programmat 250 coating furnace. The coating process known as chemical vapor deposition (CVD) was used where gasses and liquids (converted to gas) are passed over substrates to be coated at 800° to 1,100° C. and reduced pressures from 50 to 900 mBar. The reactions used to coat the hard metal substrate were as follows:

CVD of TiN—uses $H_2+N_2+$Titanium Tetrachloride ($TiCl_4$)

CVD of TiCN—uses $H_2+N_2+TiCl_4+$Acetonitrile ($CH_3CN$) or $CH_4$

CVD of $Al_2O_3$—uses $H_2+HCl+$Aluminum Chloride ($AlCl_3$)$+CO_2+H_2S$

The essential coating periods and atmospheres used to apply the titanium nitride layer, the titanium carbonitride layer and the oxide layer are set forth in the following Tables I, II and III. The gas reactants, the product of the $AlCl_3$ reactor and the liquid reactions are introduced to the furnace.

TABLE I

| Coating | Run Time Minutes | Millibar Reactor Pressure | ° C. Reactor Temp. |
|---|---|---|---|
| TiN | 60 | 160 | 920 |
| TiCN | 420 | 60 | 870 |
| $Al_2O_3$ | 270 | 60 | 1005 |

TABLE II

| | Gas Reactants Liter/Minute | | | | | |
|---|---|---|---|---|---|---|
| Coating | $H_2$ | $N_2$ | $CO_2$ | $CH_4$ | HCl | $H_2S$ |
| TiN | 14 | 9 | | | | |
| TiCN | 14 | 8 | | | | |
| $Al_2O_3$ | 11 | | 0.6 | | .20 | 0.050 |

TABLE III

| | $AlCl_3$ Gas Generator | | Liquid reactants ml/min | |
|---|---|---|---|---|
| | l/min | | $CH_3CN$ | $TiCl_4$ |
| Coating | $H_2$ | HCl | Liquid | Liquid |
| TiN | | | | 2.1 |
| TiCN | | | 125 | 2.4 |
| $Al_2O_3$ | 1.9 | 0.8 | | |

X-ray analysis of the titanium carbonitride layer demonstrated a lattice spacing of 1.516 Angstroms which, based on the analysis explained above, represents a nitrogen to carbon atomic ratio of 14:30 or a nitrogen content of 46.7% based on the total carbon and nitrogen in the carbonitride layer. The coated tool according to this example was submitted to the above-described machining test. After only 14.5 seconds, fretting was displayed.

FIG. 1 is a photomicrograph of a polished section showing the layers or coatings over the substrate. Notice that the interface between the titanium carbonitride and oxide layer is almost a straight line, that is, there are no interlocking fingers.

EXAMPLE II

A coating, according to this invention, was prepared on a tungsten carbide based substrate in the coating furnace above described with the coating periods and atmospheres as described in Tables IV, V and VI.

TABLE IV

| Coating | Run Time Minutes | Millibar Reactor Pressure | ° C. Reactor Temp. |
|---|---|---|---|
| TiN | 60 | 160 | 920 |
| TiCN | 240 | 80 | 1005 |
| $Al_2O_3$ | 540 | 60 | 1005 |

TABLE V

| | Gas Reactants Liter/Minute | | | | | |
|---|---|---|---|---|---|---|
| Coating | $H_2$ | $N_2$ | $CO_2$ | $CH_4$ | HCl | $H_2S$ |
| TiN | 14 | 9 | | | | |
| TiCN | 11.3 | 8 | | 0.6 | | |
| $Al_2O_3$ | 11 | | 0.6 | | 0.2 | .050 |

TABLE VI

| | $AlCl_3$ Gas Generator l/min | | Liquid Reactants ml/min | |
|---|---|---|---|---|
| Coating | $H_2$ | HCl | $CH_3CN$ Liquid | $TiCl_4$ Liquid |
| TiN | | | | 2.1 |
| TiCN | | | | 0.9 |
| $Al_2O_3$ | 1.9 | 0.8 | | |

Tables IV, V and VI, in addition to showing the run times, reaction pressures and temperatures, show the rate of gas reactants, aluminum chloride generator reactants and the liquid reactants. The gas reactants introduced into the aluminum chloride generator flow over aluminum metal chips producing a quantity of aluminum chloride which is passed into the coating furnace.

X-ray analysis of the titanium carbonitride layer demonstrated a lattice spacing of 1.5073 which, based on the analysis explained above, represents a nitrogen to carbon ratio of 23:30 or a nitrogen content of 75.7% based upon the total carbon and nitrogen in the carbonitride layer.

Figure 2:
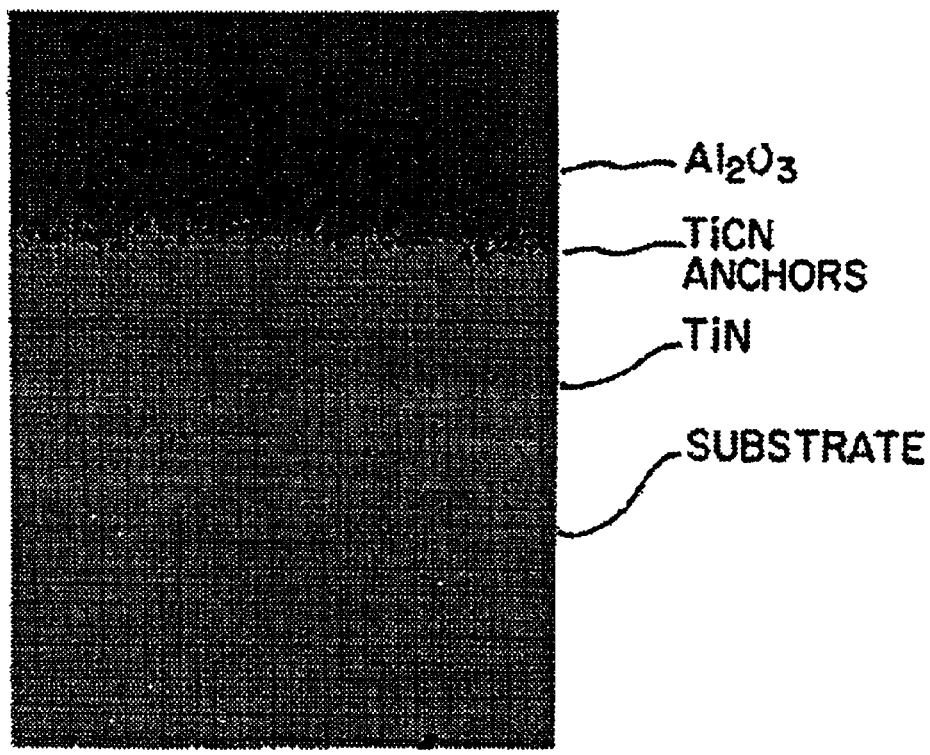
FIGS. 2–4 are photomicrographs of polished sections of hard metal cutting tool inserts, according to this invention, having an intermediate coating and an oxide coating.

The coated tool insert was submitted to the above-described machining test. The cutting test showed no fretting at 180 seconds. FIG. 2 is a photomicrograph of a polished section showing the layers of coating over the substrate. The photomicrograph illustrates fingers or anchors of the titanium carbonitride layer penetrating the oxide layer and anchoring it in place.

EXAMPLE III

Example III was prepared the same as Example II except the nitrogen was lower in the coating furnace during the deposition of the carbonitride layer. The lattice spacing in the titanium carbonitride layer was found to be 1.509 which represents a nitrogen to carbon atomic ratio of 21:30 or a nitrogen content of 70%.

Figure 3:
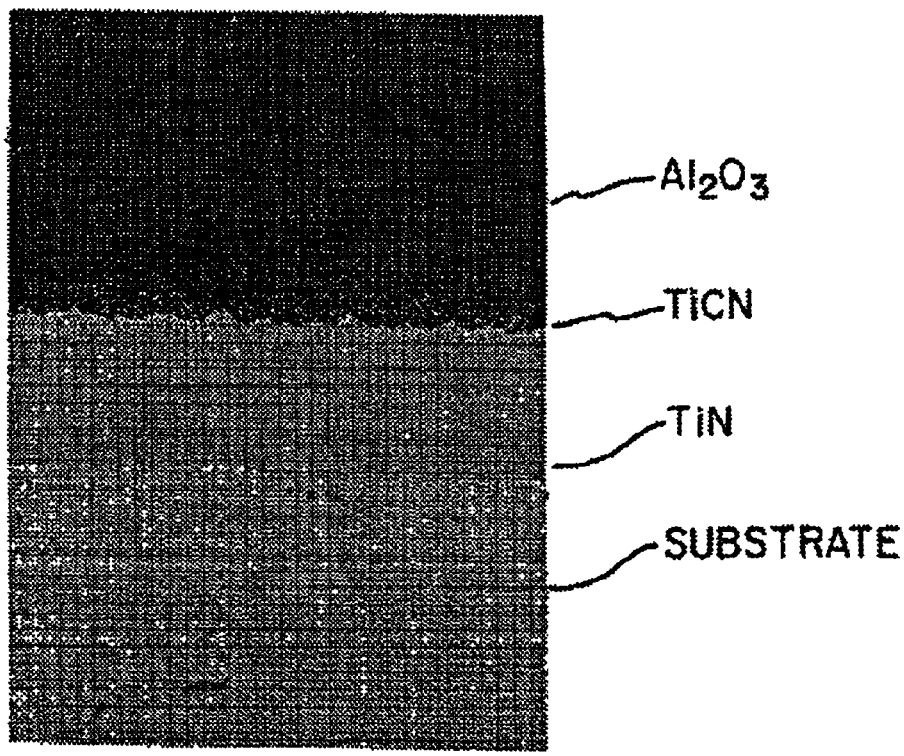

In the machining test, fretting was displayed only after a 5-inch cut length (estimated 40 to 50 seconds). The microstructure of Example II shown in FIG. 3 anchors between the oxide and the titanium carbonitride layers are displayed but are very minor.

EXAMPLE IV

Figure 4:
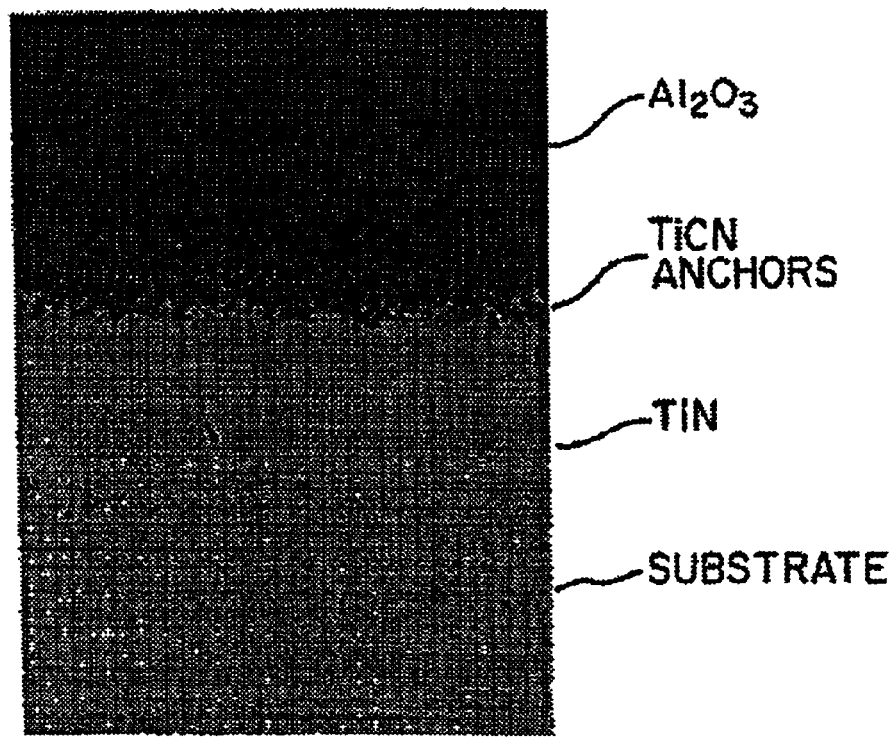

Example IV was prepared the same as Example II except with increased nitrogen flow. The lattice spacing of the titanium carbonitride layer was 1.503 Angstroms which represents a nitrogen to carbon atomic ratio of 27:30 or 90% nitrogen. In the machining test, the tool insert displayed no fretting after 120 seconds. The microstructure of Example IV is shown in FIG. 4 and illustrates prominent fingers or anchors extending between the carbonitride layer and the oxide layer.

EXAMPLE V

In the following example, tool inserts coated according to this invention were machine tested with the following cutting conditions. The stock was 3,000 gray cast iron 200 BHN. The tools tested were used to reduce the diameter of the stock as follows.

| Feed Rate (inches per revolution or IPR) | Depth of Cut (inches) | Speed (surface feet per minute or SFM) |
|---|---|---|
| .022 | .100 | 950 |

Two steel inserts, according to this invention, ran 108 pieces per edge. By comparison, a C-5 alumina coated tool insert ran 50 pieces per edge. The tool inserts, according to this invention, were a 100% improvement.

EXAMPLE VI

In the following example, the stock for the machining test was ARMA steel 250 BHN. The machining conditions were as follows.

| Feed Rate (inches per revolution or IPR) | Depth of Cut (inches) | Speed (surface feet per minute or SFM) |
|---|---|---|
| .010 | .100 | 1,200 |

Using the tool inserts, according to this invention, 170 pieces per edge were run. By comparison, with C-5 alumina coated tool inserts, 85 pieces per edge were run. The tool inserts, according to this invention, were a 100% improvement.

Coatings Reducing the Occurrence of Thermal Cracking

According to the present invention, there also is provided cutting tool inserts having a coating that reduces the occurrence of cracks resulting from thermal shock during milling and other machining operations. The coating is applied directly on the insert's hard metal substrate and includes one or more metal carbides, one or more metal nitrides, and/or one or more metal carbonitrides of hafnium and zirconium. Restated, the coating may include one or more of the materials zirconium carbide, zirconium nitride, zirconium carbonitride, hafnium carbide, hafnium nitride, and hafnium carbonitride. Hafnium carbonitride and zirconium carbonitride, for example, refer to materials including $HfC_xN_y$ and $ZrC_xN_y$, respectively, wherein $0.7<(x+y)<1.3$.

The coating of the invention is applied as the innermost layer of a multi-layer coating wherein the innermost layer inhibits the formation of thermal cracking. The additional layers of the multi-layer coating overlay the innermost layer and provide additional advantageous properties such as, for example, enhanced wear resistance and/or crater resistance. The innermost layer preferably is 2 to 5 microns in thickness so as to reduce the occurrence of thermal cracks during cutting. The additional, overlying layers may include a ceramic or oxide wear-resistant layer, in which case the additional layers also may include the novel reinforcing intermediate layer of the present invention comprising a carbonitride having a nitrogen to carbon atomic ratio, preferably between 0.7 and 0.95, that results in the formation of interlocking fingers between the ceramic or oxide wear-resistant coating and the carbonitride coating. Thus, the present invention includes coatings combining the coating of the invention that inhibits thermal cracking along with the reinforcing coating of the present invention that increases the adherence and crater-resistance of overlying wear-resistant coatings. Accordingly, embodiments of cutting tool insert within the present invention may include:

- a hard metal substrate;
- an innermost layer deposited directly on the substrate and that includes at least one of hafnium nitride and zirconium nitride;
- an exterior layer including a wear-resistant ceramic or oxide material; and
- an reinforcing layer intermediate the innermost and exterior layers and in contact with the exterior layer, wherein the intermediate layer is a metal carbonitride having a nitrogen to carbon atomic ratio between 0.7 and 0.95 and wherein projections of the metal carbonitride form in the exterior layer and enhance the adherence and crater resistance of the exterior layer.

As described in detail above, the reinforcing intermediate metal carbonitride layer more preferably has a nitrogen to carbon atomic ratio of 0.75 to 0.95 as determined by x-ray diffraction, and it also is preferred that the carbonitride layer have a nitrogen content of 70% to 90% based upon the total nitrogen and carbon content of the reinforcing layer.

Other possible coating layers that may overlay the thermal crack inhibiting coating of the present invention include wear-resistant layers composed of one or more of carbides, nitrides, borides, and oxides of metals within groups IIIA, IVB, VB, and VIB of the periodic table. Preferably, such additional layers are individually about 2 to about 10 microns in thickness.

Several cutting tool inserts according to the present invention including a layer of a metal nitride or metal carbonitride applied to the surface of a cemented carbide substrate were prepared and evaluated in the following examples.

EXAMPLE VII

Several cutting tool inserts of style SEKN42AF4B composed of H-91 grade cemented carbide material were coated with the single or multiple-layer coatings indicated in Table VII. The rightmost indicated layer (either hafnium nitride or titanium nitride) is the layer that was applied directly on the surface of the substrate. The additional layers were then applied in the indicated sequence from right to left.

TABLE VII

| Coating No. | Substrate | Coating Thickness (μm) | | | | | | |
|---|---|---|---|---|---|---|---|---|
| | | TiN | Al₂O₃ | TiCN (NL) | TiCN (MT) | TiN | HfN | Total |
| #1 | H-91 | | 2.5 | 3.4 | 6.4 | 1.5 | | 13.8 |
| #2 | H-91 | | 3.9 | <1 | | | 3.3 | 7.2 |
| #3 | H-91 | | 1.5 | | 2.1 | Trace | | 3.6 |
| #4 | H-91 | | | | | | 2.9 | 2.9 |
| #5 | H-91 | 1.2 | 2.1 | 2.7 | | 0.5 | | 6.5 |

Inserts of H-91 grade material are available from Stellram, LaVergne, Tenn., and are comprised of 88.5 weight percent tungsten carbide, 11.0 weight percent cobalt, and 0.5 weight percent of a mixture of titanium carbide, tantalum carbide, and niobium carbide. The H-91 material exhibits a hardness of 89.7 HRA, 14.40 g/cc density, and a transverse rupture strength of approximately 389,000 psi.

As indicated in Table VII, the titanium carbonitride layers in coating nos. 1, 2, 3, and 5 were applied either as a reinforcing coating (designated NL) or as a moderate temperature coating (MT). Coating no. 1 includes both titanium carbonitride coating types.

The coatings were applied to the inserts using well known CVD techniques that may be replicated by those of ordinary skill without undue effort. Hafnium nitride layers were deposited in connection with coating nos. 2 and 4 as follows. A Bernex 250 CVD coating furnace was prepared by introducing into the coating chamber of the furnace a 10 liters/minute flow of nitrogen gas. Hafnium metal sponge was placed in the generator chamber of the coating furnace and, concurrent with the nitrogen flow in the coating chamber, a flow of 5 liters/minute of nitrogen gas was introduced into generator chamber. A 200 mBar nitrogen gas pressure was established within both the coating and generator chambers. The coating chamber was then heated to 1080° C., while the generator chamber was heated to 425° C. When those temperatures were reached, the pressure within each chamber was allowed to increase to 800 mBar. While maintaining the pressure at 800 mBar, nitrogen flow into the coating chamber was increased to 10.8 liter/minute, and hydrogen gas was introduced into that chamber at 6.8 liters/minute. The original 5 liter/minute flow of nitrogen through the generator chamber was maintained. Each chamber was allowed to stabilize for about 2 minutes. A flow of chlorine gas was then introduced into the generator chamber concurrently with the 5 liters/minute flow of nitrogen gas. The concurrent flow of gases produced hafnium chlorides which, when combined with the additional gases flowing within the furnace chamber for a 12-hour period, deposited a coating of hafnium nitride on the surface of the H-91 substrate.

After the 12-hour coating time, the chlorine gas through the generator chamber was turned off, and the generator and furnace chambers were purged of gases for 20 minutes with all other conditions remaining the same. After 20 minutes, the flows of nitrogen through both the generator and coating chambers were shut off and the hydrogen flow into the generator chamber was increased to 10 liters/minute. The generator chamber temperature was lowered to room temperature, and the coating chamber temperature was allowed to ramp down to 1015° C. at a rate of 0.5° C./minute. The reduction in temperatures took approximately 130 minutes. The generator chamber charged with hafnium sponge was not used during any subsequent coating steps in inserts having coatings with additional layers.

The titanium nitride layers of coatings #1, #3, and #5 were deposited using the coating conditions provided in Example I, Tables I–III for run times as appropriate. The Al₂O₃ layers of the coatings were deposited by CVD by first heating the coating chamber to 1015° C., and then the gas flows, pressures, and times shown in Tables I–III were used. The NL titanium carbonitride layers of the coatings were deposited by first heating the insert to 1015° C. and then using the general conditions shown in Table VIII. The NL titanium carbonitride formed projections into the immediately overlying layer and enhanced the adhesion of that layer to the insert. The MT titanium carbonitride coatings were deposited by first heating the insert to a moderate temperature of 870° C. and using the general conditions shown in Tables I–III where a flow of acetonitrile is substituted for methane. The substitution of acetonitrile for methane results in a lower reaction rate and, therefore, the MT titanium carbonitride coatings do not form anchoring projections into the immediately overlying layer of the coatings.

TABLE VIII

| Total time: | 180 minutes |
|---|---|
| H₂ flow: | 11.3 l/min. |
| N₂ flow: | 10 l/min. |
| CH₄ flow: | 0.6 l/min. |
| TiCl₄ flow: | 0.9 ml/min. |
| Chamber pressure: | 300 mBar |

The resistance of the coated inserts to thermal cracking was evaluated under both wet and dry conditions using the inserts to reduce the surface of 3"×12"×6" rectangular stock of 33–35 HRC AISI type 4150 steel under the following conditions.

| Feed Rate (inches per revolution or IAR) | Depth of Cut (inches) | Speed (surface feet per minute or SFM) |
|---|---|---|
| 0.15 | .100 | 800 |

Figure 5:
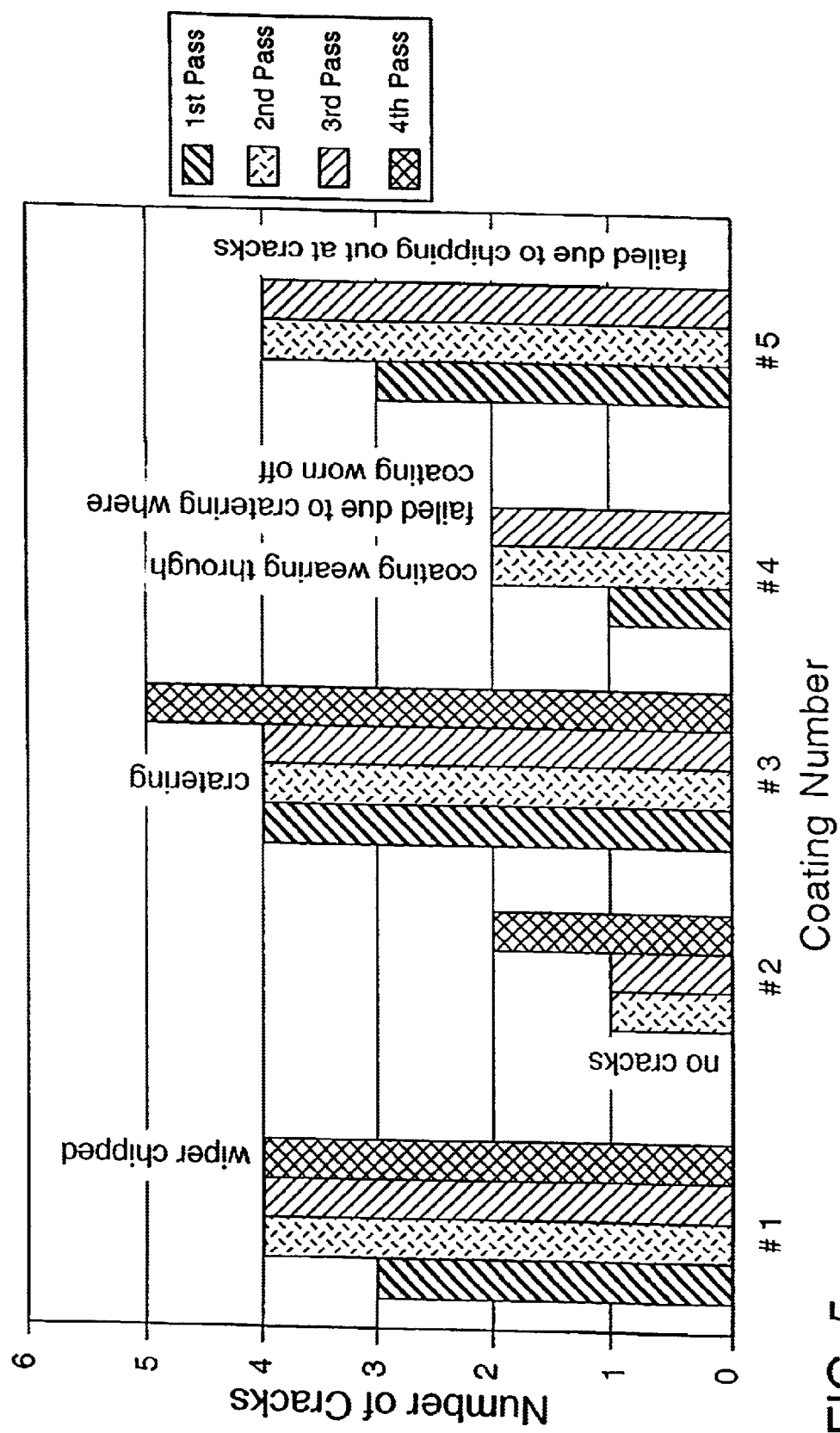
FIGS. 5 and 6 are graphs showing the total number of thermal cracks developed to failure along the edge of inserts constructed according to the present invention with various single or multiple-layer coatings during dry milling (FIG. 5) and wet milling (FIG. 6) of rectangular steel stock.
Figure 6:
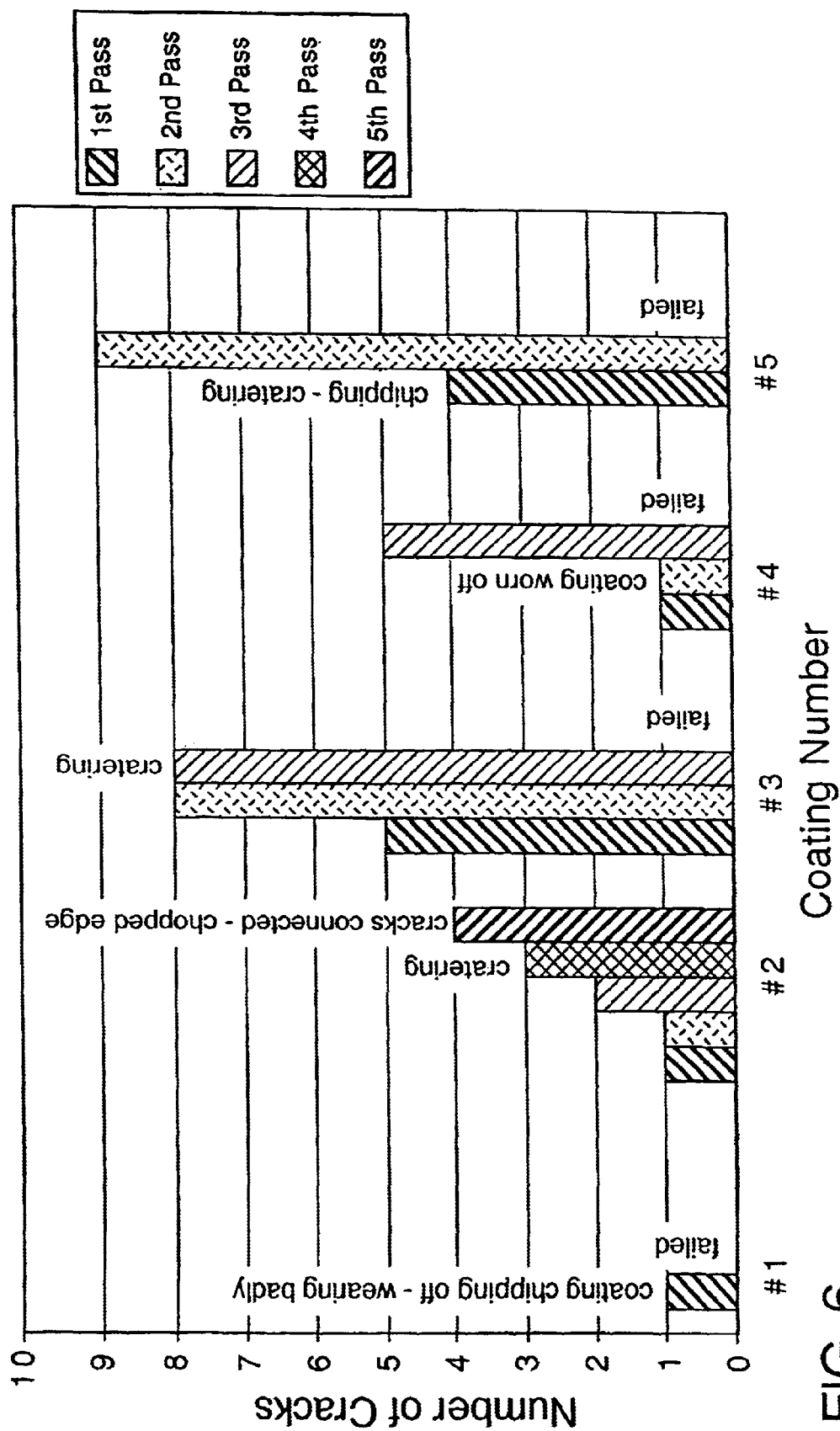

FIGS. 5 and 6 are graphs showing the total number of thermal cracks developed along the edge of each of the coated inserts after each pass until failure. Failure was defined as the condition in which thermal cracks connect and cause the insert edge to chip or deform during the cut. FIG. 5 shows data derived under dry milling conditions, while FIG. 6 shows data derived under wet milling conditions. Certain observations made during milling are indicated on the figures adjacent the pass during which the particular condition was observed.

The test data in FIGS. 5 and 6 shows that the inserts coated with an inner layer of hafnium nitride and an exterior layer of aluminum oxide (coating no. 2) performed best in both wet and dry milling, resisting formation of thermal cracks and breaking. By comparing the performance of the insert having coating no. 2 (3.3μ HFN, <1μ TiCN, and 3.9μ Al₂O₃) with that of the insert having coating no. 4 (2.9μ HFN only) under both wet and dry milling conditions, the reduction in thermal cracking achieved by addition of an aluminum oxide overlayer is seen. The insert having coating no. 3 (trace TiN, 2.1μ TiCN, and 1.5μ Al₂O₃) exhibited the least resistance to thermal cracking. The favorable performance of coating no. 2 is attributed, at least in part, to the reinforcing intermediate titanium carbonitride layer, which formed interlocking projections into and enhanced the adhesion and crater resistance of the overlying aluminum oxide layer.

It is noted that the insert sample coated only with hafnium nitride (coating no. 4) performed well (i.e., resisted thermal cracking) until the coating wore off. The superior performance of coating no. 2 indicates that an overlying wear-resistant layer applied to the hafnium nitride layer of coating no. 4 would further enhance the thermal crack inhibiting effect of that the nitride layer. Depositing the ceramic layer onto the metal nitride layer also augments the total thickness of the coating on the insert. Total coating thicknesses of 8 microns or more may be achieved by applying a ceramic layer and, possibly, one or more intermediate metal carbonitride layers onto the insert in addition to the innermost metal nitride layer.

The use of metal nitride and/or metal carbonitride layers to inhibit thermal cracking provides certain distinct advantages over conventional layers deposited by physical vapor deposition (PVD) used to reduce thermal cracking. For example, metal nitride and metal carbonitride layers may be applied by CVD, which allows for the deposition of thicker layers than by PVD. Also, nitrides and carbonitrides of hafnium and zirconium, for example, are chemical vapor deposited at relatively high temperature and will better adhere to the substrate relative to coatings applied at lower temperatures. The thermal expansion of a layer of any of the nitrides and carbonitrides of hafnium and zirconium is close to that of a cemented carbide substrate and, therefore, spalling of the metal nitride or carbonitride layer is reduced. Nitrides and carbonitrides of hafnium and zirconium also have thermal expansion coefficients close to that of overlying titanium carbonitride and/or aluminum oxide layers, thereby reducing spalling of those overlying layers. In addition, the free energies of formation of nitrides and carbonitrides of hafnium and zirconium are low and there is no tendency for eta layer formation (a hard and brittle layer generated in the substrate that reduces toughness).

EXAMPLE VIII

Additional experiments were performed to assess the performance of coatings of the present invention including a metal nitride innermost layer, a metal oxide exterior layer, and, optionally, a metal carbonitride intermediate layer. Milling inserts (style SEKN-42AF4B composed of H-91 grade cemented carbide material) were prepared with the coatings indicated in Table IX by CVD using well known deposition techniques as generally described above. Coating no. 6 includes a titanium carbonitride intermediate layer, which is absent in coating no. 7. The coated inserts were then used to reduce the top of 33–35 HRC AISI 4150 steel 3"×5"×12" rectangular stock using the machining conditions applied in Example VII above.

TABLE IX

| | | Coating Thickness (microns) | | | |
|---|---|---|---|---|---|
| Coating No. | Substrate | $Al_2O_3$ | TiCN | HfN | Total |
| #6 | H-91 | 4.5 | <1 | 3.6 | 8.1 |
| #7 | H-91 | 4.5 | none | 2.3 | 6.8 |

Figure 7:
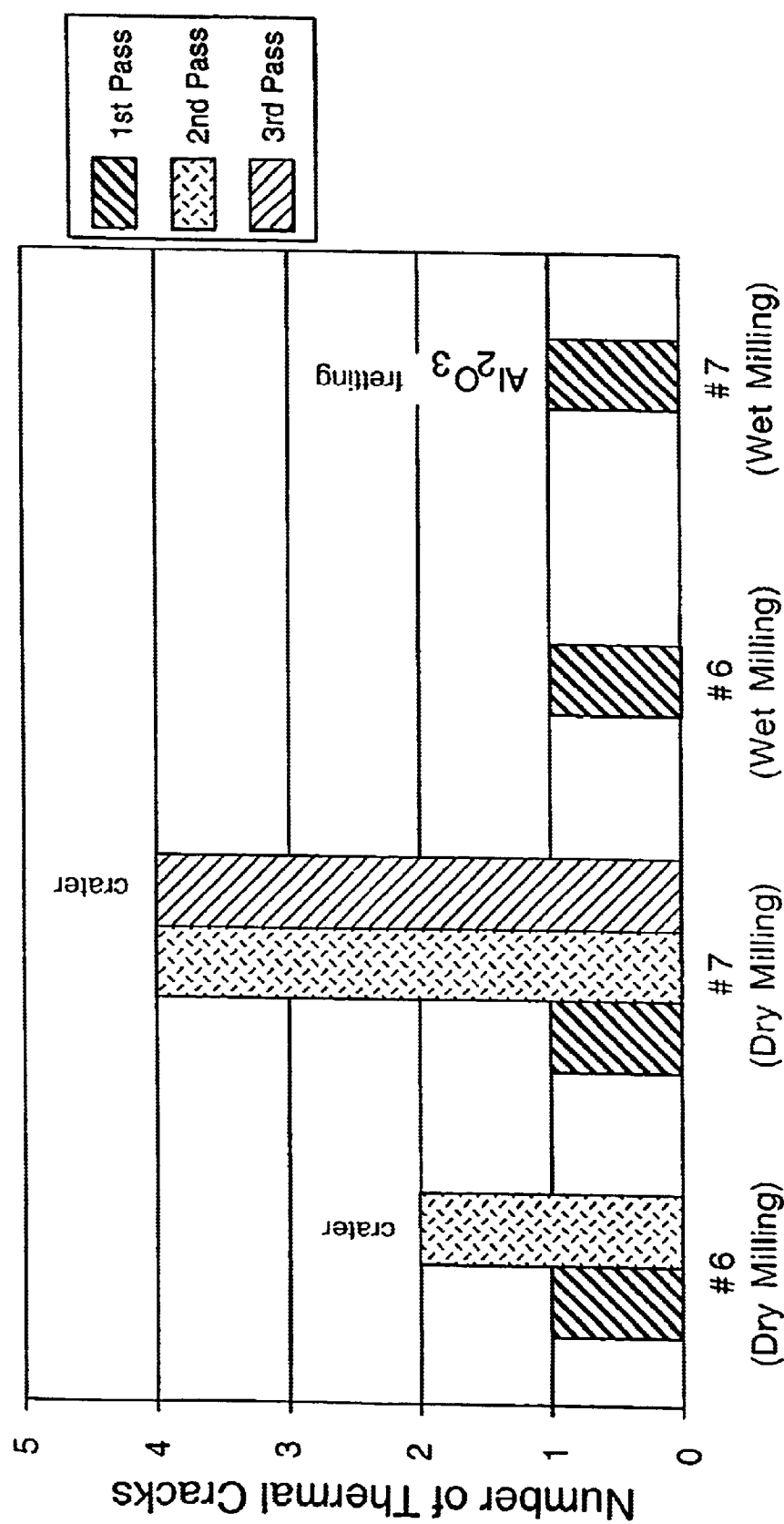
FIG. 7 is a graph showing the total number of thermal cracks developed along the edge of inserts constructed according to the present invention with coatings including hafnium nitride and aluminum oxide layers during milling of rectangular steel stock.
Figure 8:
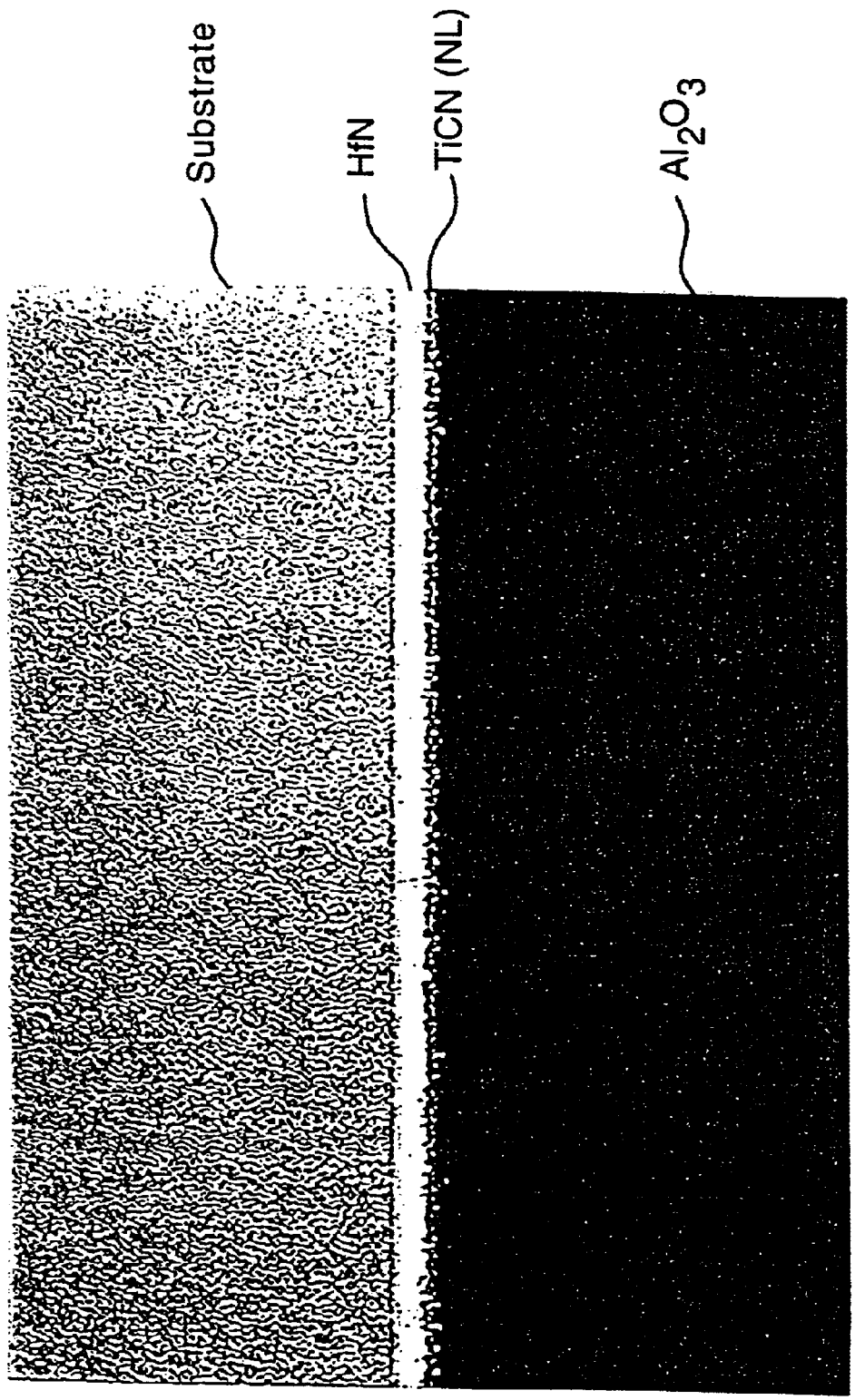
FIG. 8 is a photomicrograph of a polished section of a hard metal cutting tool, according to this invention, having a coating including a hafnium nitride innermost layer, an $Al_2O_3$ exterior layer, and a titanium carbonitride intermediate layer.

FIG. 7 is a graph showing the total number of thermal cracks developed along the edge of the coated inserts under either wet or dry milling conditions until failure. The failure condition is as described in connection with Example VII. Based on the results shown in FIG. 7, the presence of the metal carbonitride intermediate layer is preferred under wet milling conditions as it enhances the adhesion of the exterior metal oxide layer. FIG. 8 is a photomicrograph of a section through coating no. 6 showing the interlock of coatings at the interface of the titanium carbonitride and $Al_2O_3$ layers. The insert having coating no. 7 insert, which lacked the metal carbonitride intermediate layer, experienced fretting of the aluminum oxide exterior layer on the first pass during wet milling. The data of FIG. 7 also indicates that an innermost layer of hafnium nitride or zirconium nitride preferably is at least about 4 microns thick to enhance resistance to thermal cracking.

Based on the improved thermal crack resistance and the wear resistance achieved with a coating including an innermost hafnium nitride or zirconium nitride layer, a ceramic or oxide exterior layer, and, optionally, an intermediate metal carbonitride layer disposed in contact with the exterior layer, a cutting tool insert constructed as follows would exhibit particularly advantageous resistance to wear, cratering, and thermal cracking:

(i) a hard metal or cemented carbide substrate such as, for example, a cemented carbide substrate including 3 to 30 weight percent of one or more binder metals from the iron group (including iron, nickel, and cobalt) and 70 to 97 weight percent of one or more metal carbides and/or one or more metal nitrides of tungsten, titanium, tantalum, niobium, molybdenum, zirconium, or hafnium;

(ii) a 2 to 5 micron layer, applied directly on the substrate, of at least one metal nitride or metal carbonitride of zirconium or hafnium;

(iii) a 1 to 10 micron layer, exterior to layer (ii), of a wear-resistant ceramic or oxide, such as, for example, aluminum oxide;

(iv) optionally, a 2 to 6 micron layer of a metal carbonitride (for example, titanium carbonitride) deposited immediately under and in contact with the ceramic or oxide layer; and (v) optionally, a 1 to 4 micron layer of a metal nitride (for example, titanium nitride) applied exterior to the ceramic layer.

A more specific construction of a coated cutting tool insert according to the present invention may include the following in the indicated sequence:

(i) a cemented carbide substrate;
(ii) a 4 micron hafnium nitride innermost layer;
(iii) a 3–5 micron titanium carbonitride layer;
(iv) a 2–4 micron aluminum oxide layer; and
(v) a 1 micron titanium nitride exterior layer.

The metal nitride innermost layer of the above embodiments of the invention reduces the occurrence of thermal cracking. The metal nitride layer by itself, however, does not have substantial wear resistance. To enhance wear resistance, the exterior ceramic or oxide layer is also applied. To enhance the ceramic or oxide layer's adhesion and resistance to cratering, the metal carbonitride intermediate layer also may be provided. According to the present invention, the nitrogen to carbon atomic ratio of the metal carbonitride intermediate layer preferably is adjusted to the range 0.7 to 0.95, and preferably 0.7 to 0.9, to promote the formation of projections of the intermediate layer into the ceramic or oxide layer.

Having thus described our invention with the detail and particularity required by the Patent Laws, what is desired protected by Letters Patent is set forth in the following claims.

What is claimed is:

1. A method of making a cutting tool insert including a hard substrate and a plurality of coatings, the method comprising:

applying a first coating of at least 2 microns to at least a portion of the substrate, the first coating comprising at least one of a metal carbide, a metal nitride, and a metal carbonitride of a metal selected from the group consisting of zirconium and hafnium; and applying a second coating, said second coating comprising at least one of a metal nitride and a metal oxide of a metal selected from groups IIIA, IVB, VB, and VIB of the periodic table.

2. The method of claim 1, wherein said first coating is at least 2 microns up to 5 microns.

3. The method of claim 1, further comprising:

applying a third coating, intermediate said first coating and said second coating and in contact with said second coating, said third coating of a metal carbonitride 2 to 6 microns thick.

4. The method of claim 3, wherein said metal carbonitride of said third coating has a nitrogen to carbon atomic ratio between 0.7 and 0.95 which causes said metal carbonitride of said third coating to form projections into said second coating to thereby improve adherence and crater resistance of said second coating.

5. The method of claim 1, wherein said first coating is selected from the group consisting of zirconium nitride and hafnium nitride; and said second coating is selected from the group consisting of aluminum oxide and titanium nitride and is 1 to 10 microns thick.

6. The method of claim 1, wherein said plurality of coatings further comprises applying a fourth coating comprising titanium nitride overlaying the second coating, said fourth coating having a thickness of at least 1 micron.

7. A method of making a cutting tool insert including a hard substrate and a plurality of coatings, the method comprising:

applying a first coating comprising hafnium nitride to at least a portion of the substrate, said first coating having a thickness ranging from 2 to 5 microns;

applying a second coating comprising aluminum oxide, said second coating having a thickness ranging from 1 to 10 microns; and applying a third coating comprising titanium carbonitride, said third coating having a thickness ranging from 2 to 6 microns.

8. The method of claim 7 wherein the third coating is applied after applying the first coating and prior to applying the second coating.

9. The method of claim 8 wherein the titanium carbonitride of the third coating has a nitrogen to carbon atomic ratio between 0.7 and 0.95 which causes the titanium carbonitride of the third coating to form projections into the second coating to thereby improve adherence and crater resistance of the second coating.

10. The method of claim 8 wherein said plurality of coatings further comprises applying a fourth coating comprising titanium nitride overlaying the second coating, said fourth coating having a thickness of at least 1 micron.

11. A method of making a cutting tool insert including a hard substrate and a plurality of coatings, the method comprising:

depositing an inner layer on at least a portion of the substrate, the inner layer comprising at least one of a metal carbide, a metal nitride, and a metal carbonitride of a metal selected from the group consisting of zirconium and hafnium;

depositing a reinforcing layer adjacent the inner layer, the reinforcing layer comprising a metal carbonitride having a nitrogen to carbon atomic ratio between 0.7 and 0.95 as determined by x-ray diffraction and wherein the reinforcing layer comprises a plurality of projections; and depositing a wear-resistant layer adjacent the reinforcing layer, the wear-resistant layer comprising a ceramic, wherein the plurality of projections of the reinforcing layer project into the wear-resistant layer.

12. The method of claim 11 wherein the metal carbonitride of the reinforcing layer is a metal carbonitride of a metal selected from groups IIIA, IVB, VB, and VIB of the periodic table.

13. The method of claim 11, wherein the inner layer comprises hafnium nitride, the reinforcing layer comprises titanium carbonitride, and the wear-resistant layer comprises aluminum oxide.

14. The method of claim 11 wherein the inner layer is 2 to 5 microns thick; the reinforcing layer is 2 to 4 microns thick, and the wear-resistant layer is 1 to 10 microns thick.

15. The method of claim 14 further comprising depositing a fourth layer over the wear-resistant layer, the fourth layer having a thickness of 1 up to 4 microns and comprising at least one of titanium nitride and titanium carbide.

16. The method of claim 15 wherein the reinforcing layer is about 3 microns thick, the wear-resistant layer is about 6 microns thick, and the fourth layer is about 2 microns thick.

* * * * *